US012772818B2

(12) United States Patent
Wang

(10) Patent No.: US 12,772,818 B2
(45) Date of Patent: Oct. 20, 2026

(54) CONTACT STRUCTURE OF SEMICONDUCTOR DEVICE AND MANUFACTURING METHOD THEREFOR

(71) Applicant: SILICON-MAGIC SEMICONDUCTOR TECHNOLOGY (HANGZHOU) CO., LTD., Hangzhou City (CN)

(72) Inventor: Chenhan Wang, Hangzhou City (CN)

(73) Assignee: SILICON-MAGIC SEMICONDUCTOR TECHNOLOGY (HANGZHOU) CO., LTD., Hangzhou City (CN)

(*) Notice: Subject to any disclaimer, the term of this patent is extended or adjusted under 35 U.S.C. 154(b) by 363 days.

(21) Appl. No.: 18/523,509

(22) Filed: Nov. 29, 2023

(65) Prior Publication Data

US 2024/0178058 A1 May 30, 2024

(30) Foreign Application Priority Data

Nov. 30, 2022 (CN) ........................ 202211513521.8

(51) Int. Cl.

*H10W 20/00* (2026.01)
*H10D 30/01* (2025.01)
*H10D 30/66* (2025.01)

(52) U.S. Cl.

CPC ...... *H10W 20/083* (2026.01); *H10D 30/0227* (2025.01); *H10D 30/66* (2025.01)

(58) Field of Classification Search

CPC ............ H10W 20/083; H10W 20/047; H10W 20/069; H10W 20/40; H10W 20/42; H10D 30/0227; H10D 30/66; H10D 64/0112; H10D 30/60; H10D 62/83; H10D 64/256; H10D 64/62

See application file for complete search history.

(56) References Cited

U.S. PATENT DOCUMENTS

| | | | | |
|---|---|---|---|---|
| 2016/0351570 | A1* | 12/2016 | Park | H10D 84/853 |
| 2019/0122920 | A1* | 4/2019 | Su | H10D 62/021 |
| 2019/0371898 | A1* | 12/2019 | Huang | H10D 30/6219 |
| 2021/0091190 | A1* | 3/2021 | Huang | H10D 30/6219 |

* cited by examiner

*Primary Examiner* — Julia Slutsker

(74) *Attorney, Agent, or Firm* — Osha Bergman Watanabe & Burton LLP

(57) ABSTRACT

A semiconductor device includes an epitaxial layer and a doped region located in the epitaxial layer. A contact structure of the semiconductor device includes: an interlayer dielectric layer, arranged on the epitaxial layer; a contact hole, including a first portion extending through the interlayer dielectric layer and a second portion extending into the doped region, where a size of the first portion is greater than a size of the second portion, the second portion is open on a bottom surface of the first portion, and a bottom surface of the second portion is arranged in the doped region; a contact layer, including a first contact layer arranged on the bottom surface of the first portion and a second contact layer arranged on the bottom surface of the second portion; and a conductive channel, arranged in the contact hole and contacting the contact layer.

23 Claims, 11 Drawing Sheets

CONTACT STRUCTURE OF SEMICONDUCTOR DEVICE AND MANUFACTURING METHOD THEREFOR

TECHNICAL FIELD

This application relates to the technical field of semiconductors, and in particular, to a contact structure of a semiconductor device and a manufacturing method therefor.

BACKGROUND

A semiconductor device, for example, a metal oxide semiconductor field-effect transistor (MOSFET), generally includes an epitaxial layer, a source region and a drain region formed inside the epitaxial layer, and a conductive channel that provides an electrical connection between the source region and the drain region. A contact resistance between the conductive channel and the epitaxial layer is relatively high.

Generally, a metal silicide layer is formed on a surface of the epitaxial layer to reduce the contact resistance and reduce the contact resistance between the conductive channel and the epitaxial layer.

However, with the development of semiconductor technologies, a feature size of the semiconductor device becomes increasingly small. With an integration density of a device on a chip increases, the performance and functionality of the chip improves. However, high-density integration also causes new problems. Since the feature size of the semiconductor device becomes increasingly small, a cross-sectional area of the conductive channel decreases, and a contact area between the conductive channel and the metal silicide layer also gradually decreases, so that the contact resistance between the conductive channel and the epitaxial layer gradually increases.

SUMMARY

According to one or more embodiments of the present disclosure, a contact structure of a semiconductor device, wherein the semiconductor device comprises an epitaxial layer and a doped region located in the epitaxial layer, and the contact structure comprises: an interlayer dielectric layer, arranged on the epitaxial layer; a contact hole, comprising a first portion extending through the interlayer dielectric layer and a second portion extending into the doped region, wherein a size of the first portion is greater than a size of the second portion, the second portion is open on a bottom surface of the first portion, and a bottom surface of the second portion is arranged in the doped region; a contact layer, comprising a first contact layer arranged on the bottom surface of the first portion and a second contact layer arranged on the bottom surface of the second portion; and a conductive channel, arranged in the contact hole and contacting the contact layer.

According to one or more embodiments of the present disclosure, a manufacturing method for manufacturing a contact structure of a semiconductor device, wherein the semiconductor device comprises an epitaxial layer and a doped region located in the epitaxial layer, and the manufacturing method comprises: forming an interlayer dielectric layer on the epitaxial layer; forming a contact hole, wherein the contact hole comprises a first portion extending through the interlayer dielectric layer and a second portion extending into the doped region, a size of the first portion is greater than a size of the second portion, the second portion is open on a bottom surface of the first portion, and a bottom surface of the second portion is arranged in the doped region; forming a contact layer, wherein the contact layer comprises a first contact layer arranged on the bottom surface of the first portion and a second contact layer arranged on the bottom surface of the second portion; and forming a conductive channel filling the contact hole and contacting the contact layer.

DETAILED DESCRIPTION

Figure 1:
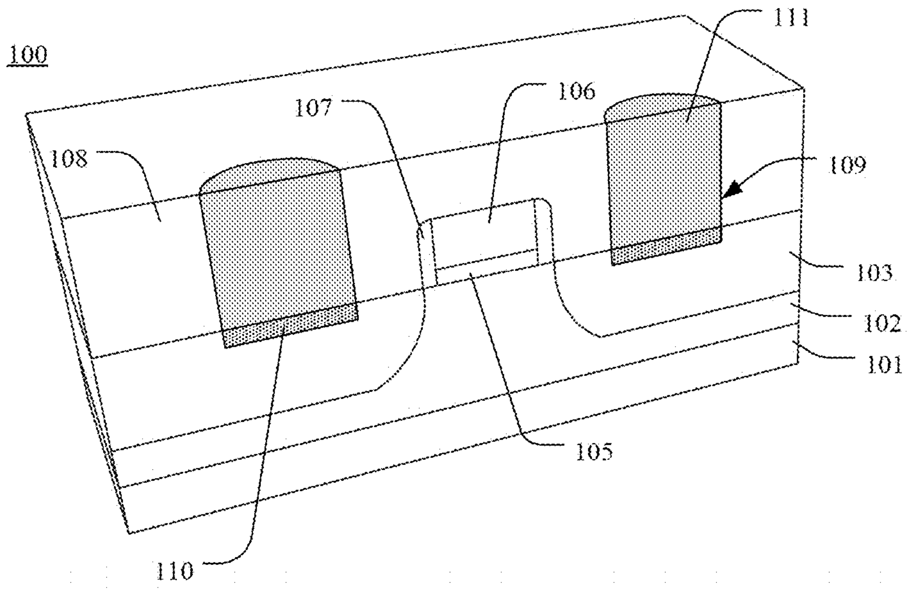
FIG. 1 shows schematic structural diagrams of one or more embodiments of a semiconductor device.

The present disclosure will be described in more detail below with reference to the accompanying drawings. In each accompanying drawing, the same elements are denoted by the similar reference numerals. For the sake of clarity, each part in the accompanying drawings is not drawn to scale. In addition, some well-known parts may not be shown. For the sake of simplicity, a semiconductor structure obtained after several steps may be described in a drawing.

It should be understood that, during the description of the structure of a device, when a layer or region is referred to as being located "on" or "above" another layer or region, it may be directly located on another layer or region, or other layers or regions are also included between it and another layer or region. Moreover, if the device is turned over, the layer or region will be located "under" or "below" another layer or region.

In order to describe the situation of being directly located on another layer or region, the expression "directly on . . . " or "on and adjacent to . . . " will be adopted herein.

Unless otherwise specified below, various parts of the semiconductor device may be composed of materials known to those skilled in the art. Semiconductor materials include, for example, III-V semiconductors, such as gallium arsenide (GaAs), gallium nitride (GaN), etc., IV-IV semiconductors, such as silicon carbide (SiC), etc., II-VI compound semiconductors, such as cadmium sulfide (CdS), cadmium telluride (CdTe), etc., and Group IV semiconductors, such as silicon (Si), germanium (Ge), etc. The gate conductor can be formed of various materials capable of conducting electricity, such as a metal layer, a doped polysilicon layer, or a stacked gate conductor including a metal layer and a doped polysilicon layer, or other conductive materials, such as TaC, TiN, TaSiN, HfSiN, TiSiN, TiCN, TaAlC, TiAlN, TaN, PtSix, Ni3Si, Pt, Ru, W, and combinations of various conductive materials. The gate dielectric may be made of SiO2 or a material with a dielectric constant greater than SiO2, including oxides, nitrides, oxynitrides, silicates, aluminates, and titanates, for example. Also, the gate dielectric may not only be formed of materials known to those skilled in the art, but also materials for gate dielectrics developed in the future may be used.

Semiconductor devices are, for example, VDMOSFET (vertical double diffused metal oxide semiconductor), LDMOSFET (lateral double diffused metal oxide semiconductor field effect transistor), trench MOSFET (trench metal oxide semiconductor field effect transistor), etc. LDMOSFET is used as an example for description, but it is not limited herein.

FIG. 1 shows a schematic structural diagram of one or more embodiments of a semiconductor device. As shown in FIG. 1, a semiconductor device 100 includes a semiconductor substrate 101, an epitaxial layer 102 located on the semiconductor substrate 101, a gate conductor 106, a gate dielectric 105 located between the gate conductor 106 and the epitaxial layer 102, a spacer 107 surrounding the gate conductor 106, and a source region 103 and a drain region 104 located in the epitaxial layer 102. The gate conductor 106 and the gate dielectric 105 form a gate stack of the semiconductor device.

The semiconductor device 100 further includes an interlayer dielectric layer 108. The interlayer dielectric layer 108 covers a surface of the epitaxial layer 102, and a contact hole 109 is formed in the interlayer dielectric layer 108. The contact hole 109 extends to the surface of the epitaxial layer 102 through the interlayer dielectric layer 108. A bottom of the contact hole 109 is covered with a contact layer 110, and the contact hole 109 on the contact layer 110 is filled with a conductive material to form a conductive channel 111. A contact resistance is reduced by forming the contact layer 110 on the bottom of the contact hole 109. In one or more embodiments, the contact layer 110 is a metal silicide layer.

The contact resistance can be further reduced by increasing a contact area between the contact layer 110 and the epitaxial layer 102. In the above one or more embodiments, a method for increasing the contact area between the contact layer 110 and the epitaxial layer 102 is increasing a diameter of the contact hole 109, so as to increase a bottom surface area of the contact hole 109 and then increase an area of the contact layer 110 located on the bottom of the contact hole 109.

Figure 2:
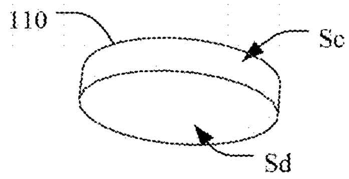
FIG. 2 shows a schematic structural diagram of a contact layer of a semiconductor device.

FIG. 2 shows a schematic structural diagram of a contact layer of a semiconductor device. As shown in FIG. 1 and FIG. 2, a bottom surface and a side wall of the contact layer 110 contact the epitaxial layer 102. In the semiconductor device 100, when a distance between the conductive channel 111 and the gate conductor 106 is L and a thickness of the contact layer 110 is H, a contact area S0 between the contact layer 110 and the epitaxial layer 102 is a sum of a bottom surface area Sd and a side surface area Sc of the contact layer 110, that is, S0=Sd+Sc.

Figure 3:
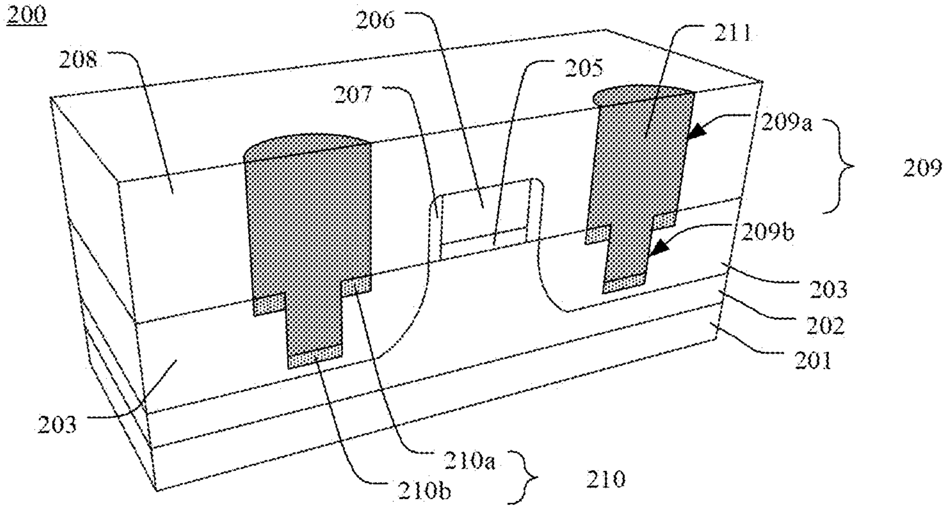
FIG. 3 show schematic structural diagrams of a semiconductor device according to one or more embodiments of the present disclosure.

FIG. 3 shows a schematic structural diagram of a semiconductor device according to one or more embodiments of the present disclosure. As shown in FIG. 3, a semiconductor device 200 includes a semiconductor substrate 201, an epitaxial layer 202 located on the semiconductor substrate 201, a doped region 203 located inside the epitaxial layer 202, a gate conductor 206, a gate dielectric 205 located between the gate conductor 206 and the epitaxial layer 202, and a spacer 207 surrounding the gate conductor 206. The gate conductor 206 and the epitaxial layer 202 are separated by the gate dielectric 205, and the gate conductor 206 and the gate dielectric 205 form a gate stack structure of the semiconductor device.

The semiconductor device 200 further includes a contact structure. The contact structure includes an interlayer dielectric layer 208, a contact hole 209 extending through the interlayer dielectric layer 208 to the doped region 203 inside the epitaxial layer 202, a contact layer 210 located on a bottom surface of the contact hole 209, and a conductive channel 211 that fills the contact hole 209 and contacts the contact layer 210. The interlayer dielectric layer 208 covers a surface of the epitaxial layer 202. The contact hole 209 includes a first portion 209*a* extending through the interlayer dielectric layer 208 and a second portion 209*b* extending into the doped region 203. A size of the first portion 209*a* is greater than a size of the second portion 209*b*, the second portion 209*b* is open on a bottom surface of the first portion 209*a*, and a bottom surface of the second portion 209*b* is arranged in the doped region 203. The contact layer 210 is located on the bottom surface of the first portion 209*a* and the bottom surface of the second portion 209*b*. The contact layer 210 is, for example, a metal silicide layer. The contact hole 209 is filled with a conductive material to form a conductive channel 211, and the conductive channel 211 contacts the contact layer 210.

In a lateral double-diffused MOSFET (LDMOSFET) structure, the doped region 203 is a source region and a drain region. The source region and the drain region are located in the epitaxial layer and are symmetrically distributed on two sides of the gate conductor 206. The contact hole 209 (which is specifically the second portion 209*b* of the contact holes 209) reaches the source region and the drain region inside the epitaxial layer 202.

In a vertical double-diffused MOSFET (VDMOSFET) structure and a trench MOSFET structure, the doped region 203 is the source region, and the contact hole 209 (which is specifically the second portion 209*b* of the contact hole 209) reaches the source region inside the epitaxial layer 202.

Figure 4A:
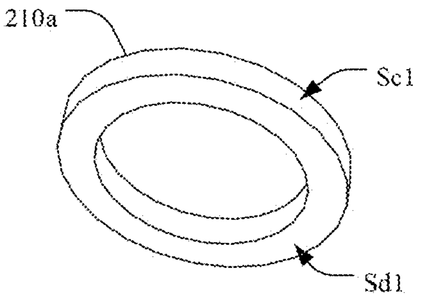
FIG. 4A show schematic structural diagrams of first contact layer according to one or more embodiments of the present disclosure.
Figure 4B:
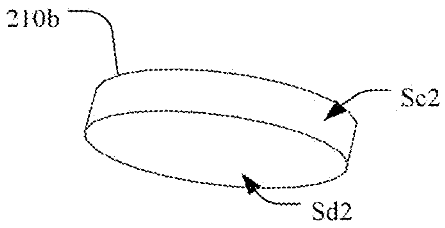
FIG. 4B show schematic structural diagrams of second contact layer according to one or more embodiments of the present disclosure.

The contact layer 210 includes a first contact layer 210*a* located on the bottom surface of the first portion 209*a* of the contact hole 209 and a second contact layer 210*b* located on the bottom surface of the second portion 209*b* of the contact hole 209. FIG. 4A shows a schematic structural diagram of the first contact layer according one or more embodiments of the present disclosure. FIG. 4B shows a schematic structural diagram of the second contact layer according to one or more embodiments of the present disclosure. As shown in FIG. 4A and FIG. 4B, the first contact layer 210*a* and the second contact layer 210*b* are defined with a certain thickness in a direction perpendicular to the epitaxial layer 202, to increase a contact area between the first contact layer 210*a* and the second contact layer 210*b* and the epitaxial layer 202. Specifically, the first contact layer 210*a* is an annular body surrounding the conductive channel 211, an outer side wall and an annular bottom surface of the first contact layer 210*a* contact the epitaxial layer 202, and a top surface and an inner side wall of the first contact layer 210*a* contact the conductive channel 211. A contact area S1 between the first contact layer 210*a* and the epitaxial layer 202 is a sum of a bottom surface area Sd1 of the first contact layer 210*a* and a side surface area Sc1 of the first contact layer 210*a*, that is, S1=Sd1+Sc1. The second contact layer 210*b* is a pillar. An outer side wall and a bottom surface of the second contact layer 210*b* contact the epitaxial layer 202, and a top surface of the second contact layer 210*b* contacts the conductive channel 211. A contact area S2 between the second contact layer 210*b* and the epitaxial layer 202 is a sum of a bottom surface area Sd2 of the second contact layer 210*b* and a side surface area Sc2 of the second contact layer 210*b*, that is, S2=Sd2+Sc2.

A contact area S between the contact layer 210 and the epitaxial layer is a sum of the contact area S1 between the first contact layer 210*a* and the epitaxial layer 202 and the contact area S2 between the second contact layer 210*b* and the epitaxial layer 202, that is, S=S1+S2=Sd1+Sc1+Sd2+Sc2=(Sd1+Sd2)+Sc1+Sc2.

When a distance between the conductive channel 211 and the gate conductor 206 is L and the thicknesses of the first contact layer 210*a* and the second contact layer 210*b* are both H, a sum of the bottom surface area Sd1 of the first contact layer 210*a* and the bottom surface area Sd2 of the second contact layer 210*b* is equal to the bottom surface area Sd of the contact layer 110 in the semiconductor device 100 in previously described one or more embodiments. The side surface area Sc1 of the first contact layer 210*a* is equal to the side surface area Sc of the contact layer 110 in the semiconductor device 100 previously described one or more embodiments.

In one or more embodiments, the contact area between the contact layer 210 and the epitaxial layer 202 is S=(Sd1+Sd2)+Sc1+Sc2=Sd+Sc+Sc2=S0+Sc2. That is to say, compared with the semiconductor device 100 in previously described one or more embodiments, the contact area between the contact layer 210 of this application and the epitaxial layer is relatively large, and therefore the semiconductor device 200 of one or more embodiments has a smaller contact resistance than that of the previously described one or more embodiments.

A certain distance (a minimum distance is, for example, L) needs to be kept between the conductive channel and the gate conductor to prevent a short circuit between the conductive channel and the gate conductor. Therefore, when a feature size of the semiconductor device is required to be increasingly small, one or more embodiments described herein can further improve the contact resistance of the semiconductor device without increasing the diameter of the contact hole.

In one or more embodiments, a cross-sectional shape of the contact hole 209 in a horizontal direction is a circle. Accordingly, the first contact layer 210*a* is circular, and the second contact layer 210*b* is cylindrical. In one or more embodiments, the cross-sectional shape of the contact hole 209 may further be other shapes such as an oval, a polygon, and the like. The shapes of the first contact layer 210*a* and the second contact layer 210*b* is also adaptively changed, which is not limited herein.

A lower surface of the first contact layer 210*a* is higher than an upper surface of the second contact layer 210*b*, or the lower surface of the first contact layer 210*a* is flush with the upper surface of the second contact layer 210*b*, to avoid a case that the inner side wall of the first contact layer 210*a* partially or completely contacts the outer side wall of the second contact layer 210*b* in the direction perpendicular to the epitaxial layer 202, to further lose a part or all of the contact area between the second contact layer 210*b* and the epitaxial layer 202.

FIG. 5A to FIG. 5E show sectional views of stages of a manufacturing method for manufacturing a semiconductor device according to one or more embodiments of the present disclosure. The LDMOSFET structure is used as a non-limiting example for description in one or more embodiments, which is not limited herein.

Figure 5A:
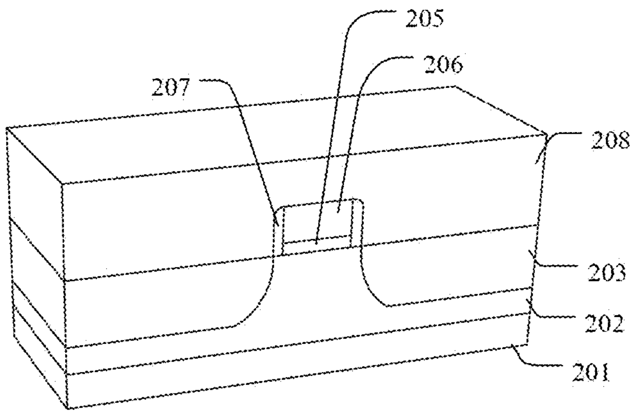
FIG. 5A-5E show sectional views of stages of a manufacturing method for manufacturing a semiconductor device according to one or more embodiments of the present disclosure.

As shown in FIG. 5A, the manufacturing method starts with the semiconductor structure shown in FIG. 5A. A main part of the semiconductor device is already formed in the semiconductor structure, including a semiconductor substrate 201, an epitaxial layer 202, a gate conductor 206, and a gate dielectric 205 located between the gate conductor 206 and the epitaxial layer 202. The gate conductor 206 and the gate dielectric 205 form a gate stack structure of the semiconductor device.

The semiconductor device 200 further includes a doped region 203 and a spacer 207. The gate stack structure and the spacer 207 are located on the epitaxial layer, and the spacer 207 surrounds the gate conductor 206.

The semiconductor substrate 201 may be any known semiconductor material, including, for example, a silicon (Si) substrate or a germanium (Ge) substrate. The epitaxial layer 202 is located on the semiconductor substrate 201, and the material of the epitaxial layer 202 is polysilicon, for example.

The gate conductor 206 may be formed of various materials capable of conducting electricity, for example, a metal layer, a doped polysilicon layer, or a stack including the metal layer and the doped polysilicon layer, or other conductive materials. The gate dielectric 205 may be made of SiO2 or a material having a dielectric constant greater than that of SiO2, including, for example, an oxide, a nitride, an oxynitride, and the like. Moreover, the gate dielectric may be formed not only by the material known to those skilled in the art, but also by the material developed for the gate dielectric in the future. The spacer 207 may be made of silicon oxide, silicon nitride, or other well-known insulating materials.

Next, the interlayer dielectric layer 208 is formed.

In this step, the interlayer dielectric layer 208 is formed on the surface of the semiconductor structure by a known deposition process, such as electron beam evaporation (EBM), chemical vapor deposition (CVD), atomic layer deposition (ALD), sputtering, and the like. Mechanical planarization (such as chemical mechanical polishing) is further performed to obtain a flat surface. The interlayer dielectric layer 208 covers the surface of the epitaxial layer 202. The interlayer dielectric layer 208 can be made of, for example, silicon oxide, silicon nitride or other known insulating materials.

Figure 5B:
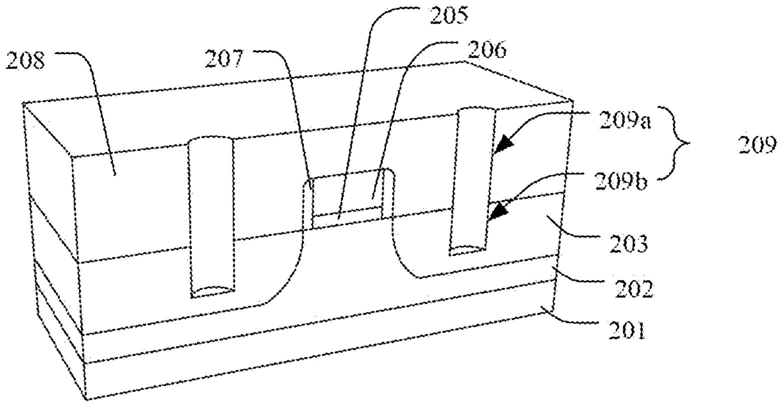

As shown in FIG. 5B, a contact hole 209 extending through the interlayer dielectric layer 208 to the inside of the epitaxial layer 202 is formed.

In this step, for example, a photoresist mask is formed on a surface of a semiconductor structure and then etched, to form a contact hole 209 reaching the inside of the epitaxial layer 202 in the interlayer dielectric layer 208. The etching may be dry etching such as ion milling etching, plasma etching, reactive ion etching, or laser ablation, or may be wet etching using an etchant solution. Etching proceeds downward from an opening in the photoresist mask into the epitaxial layer 202 through the interlayer dielectric layer 208. That is to say, the contact hole 209 includes a first portion 209*a* extending through the interlayer dielectric layer 208 and a second portion 209*b* extending to the inside of the epitaxial layer 202. The second portion 209*b* of the contact hole 209 is open on the bottom surface of the first portion 209*a* of the contact hole 209. The photoresist mask is removed by dissolving or ashing in a solvent after the etching.

Figure 5C:
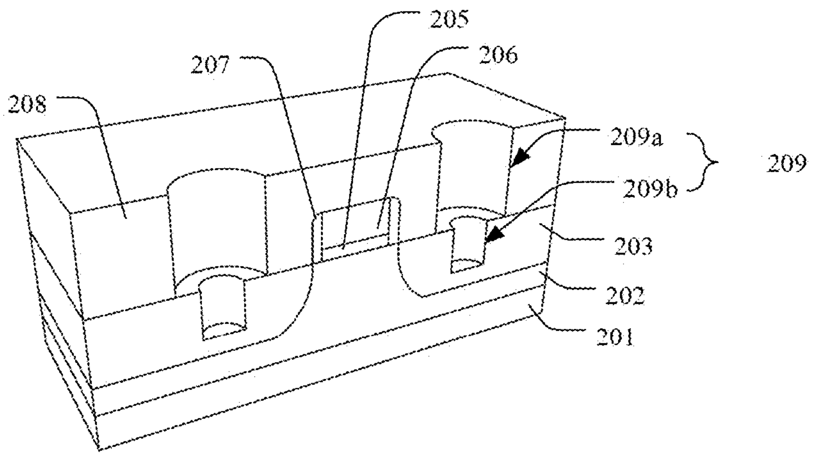

As shown in FIG. 5C, a side wall of the first portion 209*a* of the contact hole 209 is selectively etched, so that the size of the first portion 209*a* of the contact hole 209 is greater than the size of the second portion 209*b* of the contact hole 209.

In this step, for example, the side wall of the first portion 209*a* of the contact hole 209 is selectively etched through wet etching. Through the selectivity of the etchant solution, the side wall of the second portion 209*b* of the contact hole 209 is substantially unaffected when the side wall of the first portion 209*a* of the contact hole 209 is partially removed, so that the first portion 209*a* and the second portion 209*b* of the contact hole 209 have different inner diameters. Specifically, the size of the first portion 209*a* of the contact hole 209 is greater than the size of the second portion 209*b* of the contact hole 209.

Figure 5D:
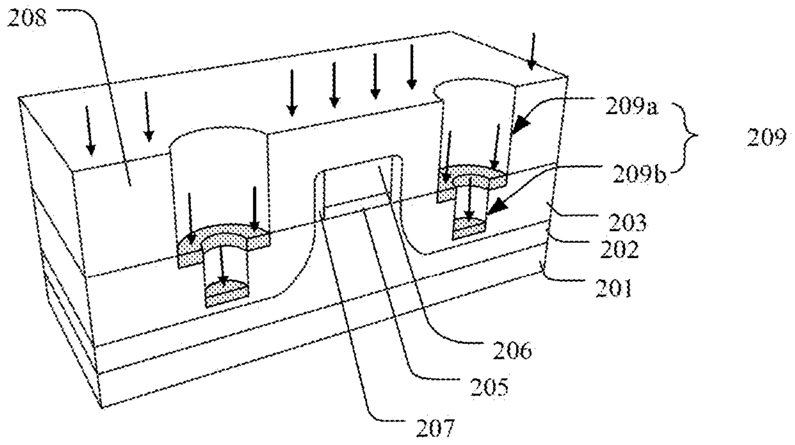

As shown in FIG. 5D, ion implantation is performed on the bottom surface of the first portion 209*a* of the contact hole 209 and the bottom surface of the second portion 209*b* of the contact hole 209.

In this step, the ion implantation is performed on the semiconductor structure. During the ion implantation, since the direction of ion implantation is perpendicular to the direction of the epitaxial layer 202, the ion implantation is performed on the bottom surface of the first portion 209*a* of the contact hole 209 and the bottom surface of the second portion 209*b* of the contact hole 209 but not on the side wall of the first portion 209*a* of the contact hole 209 and the side wall of the second portion 209*b* of the contact hole 209. Lattices of the bottom surface of the first portion 209*a* of the contact hole 209 and the bottom surface of the second portion 209*b* of the contact hole 209 on which the ion implantation is performed are dispersed to form the contact layer 210 more easily in the subsequent process.

Figure 5E:
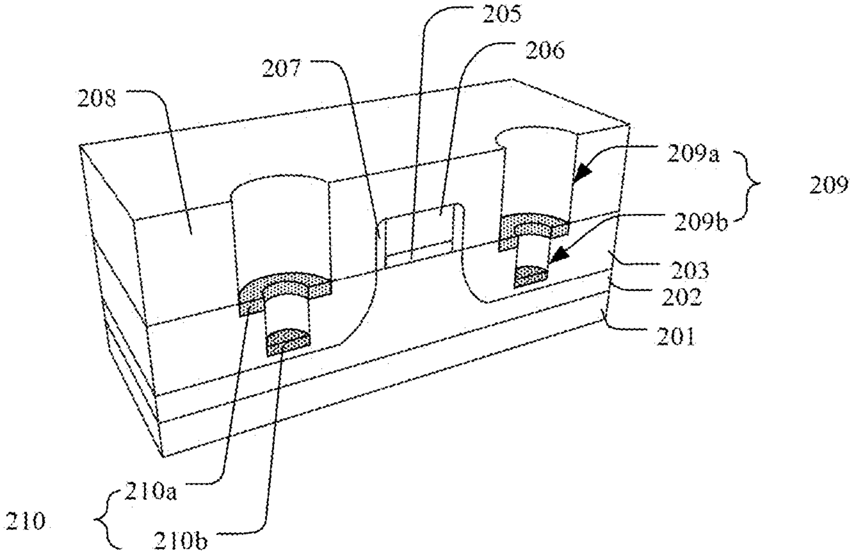

As shown in FIG. 5E, the contact layer 210 is formed on the bottom surface of the first portion 209*a* of the contact hole 209 and the bottom surface of the second portion 209*b* of the contact hole 209.

In the step, for example, a metal layer is formed on the bottom surface of the first portion 209*a* of the contact hole 209 and the bottom surface of the second portion 209*b* of the contact hole 209. The metal layer is, for example, a nickel (Ni) layer, a platinum (Pt) layer, a cobalt (Co) layer, a nickel-platinum alloy layer, a nickel-cobalt alloy layer, a platinum-cobalt alloy layer, a nickel-platinum-cobalt ternary alloy layer, and the like.

In one or more embodiments, the metal layer is caused to react with silicon on the surface of the doped epitaxial layer 202 by using an annealing process, to form the corresponding contact layer 210. The contact layer 210 includes a first contact layer 210*a* located on the bottom surface of the first portion 209*a* of the contact hole 209 and a second contact layer 210*b* located on the bottom surface of the second portion 209*b* of the contact hole 209. The contact layer 210 may be NiSi, PtSi, CoSi2, NiPtSi, NiCoSi2, PtCoSi2, NiPt-CoSi2, etc. according to the material of the metal layer.

A conductive layer is formed by using the foregoing known deposition process to deposit conductive material, and the thickness of the conductive material deposited at least fills the contact hole 209. The interlayer dielectric layer 208 is used as a stop layer, and mechanical planarization (for example, chemical mechanical polishing) is performed to remove a part of the conductive material located outside of the contact hole 209. As a result, the remaining part of the conductive material fills the contact hole 209 and contacts the contact layer 210 to form the conductive channel 211. The bottom of the conductive channel 211 contacts the epitaxial layer 202 through the contact layer 210. In one or more embodiments, the conductive channels 211 may all be composed of tungsten.

Figure 6:
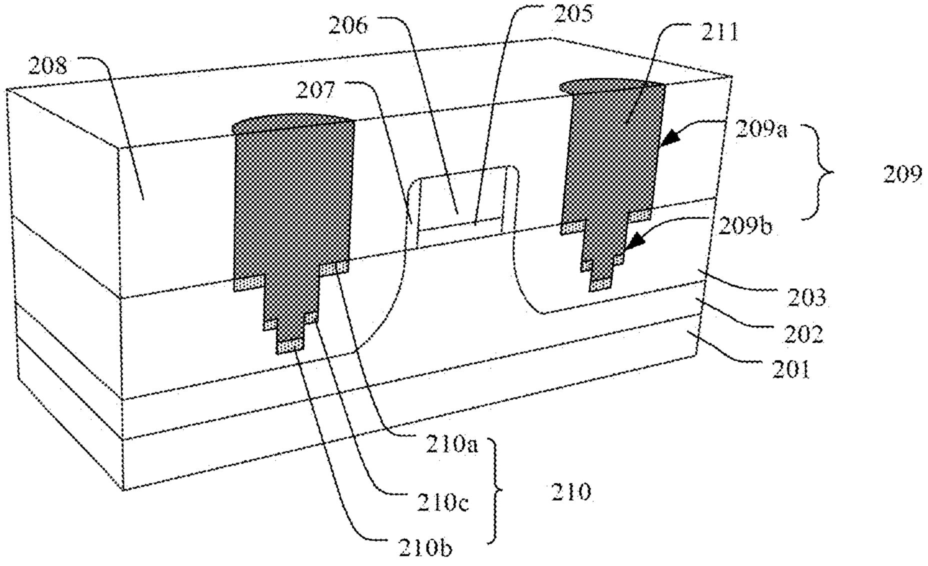
FIG. 6 show schematic structural diagrams of a semiconductor device according to one or more embodiments of the present disclosure.

FIG. 6 shows a schematic structural diagram of a semiconductor device according to one or more embodiments of the present disclosure. As shown in FIG. 6, different from the embodiments shown in FIG. 3, in one or more embodiments disclosed herein, the second portion 209*b* of the contact hole 209 includes a plurality of levels of second contact holes. The second contact hole of each level is open on a bottom surface of the second contact hole of a previous level, and sizes of the plurality of levels of second contact holes successively decrease from top to bottom.

The contact layer 210 further includes a third contact layer 210*c* arranged on the bottom surface of the second contact hole of each level, and the third contact layer 210*c* is an annular body surrounding the conductive channel. Adjacent third contact layers 210*c* are separated from each other or connected as a whole.

In one or more embodiments, a third contact layer is added between the first contact layer and the second contact layer, which further increases the area of the contact layer 210 and then reduces the contact resistance.

FIG. 7A to FIG. 7F show sectional views of stages of a manufacturing method for manufacturing a semiconductor device according to one or more embodiments of the present disclosure.

Figure 7A:
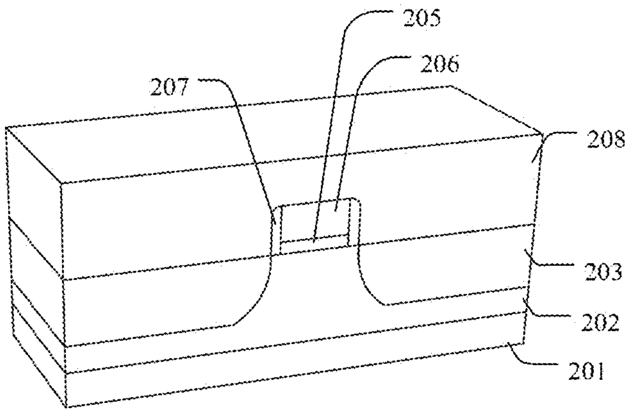
FIG. 7A-7F show sectional views of stages of a manufacturing method for manufacturing a semiconductor device according to one or more embodiments of the present disclosure.

The step shown in FIG. 7A is the same as the step shown in FIG. 5A, and will not be repeated herein.

Figure 7B:
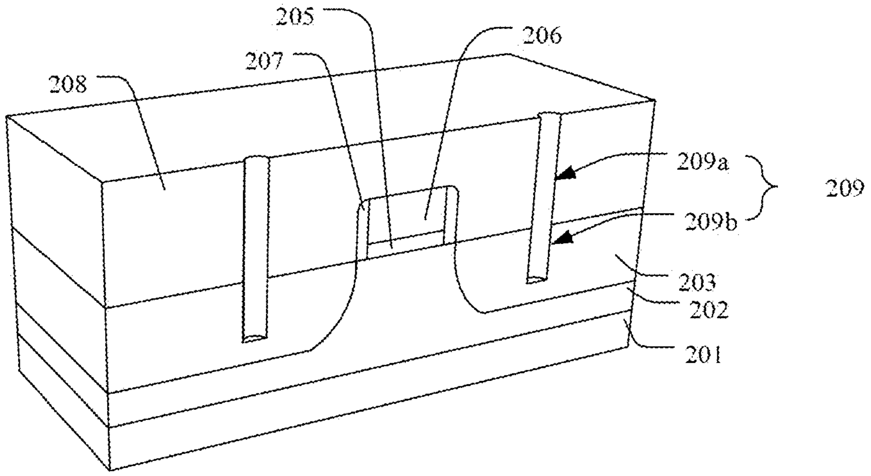

As shown in FIG. 7B, a contact hole 209 is formed.

In this step, for example, a first photoresist mask is formed on a surface of a semiconductor structure and then etched, to form a contact hole 209 reaching the inside of the epitaxial layer 202 in the interlayer dielectric layer 208. The etching may be dry etching such as ion milling etching, plasma etching, reactive ion etching, or laser ablation, or may be wet etching using an etchant solution. Etching proceeds downward from an opening in the photoresist mask into the epitaxial layer 202 through the interlayer dielectric layer 208. That is to say, the contact hole 209 includes a first portion 209*a* extending through the interlayer dielectric layer 208 and a second portion 209*b* extending to the inside of the epitaxial layer 202. The photoresist mask is removed by dissolving or ashing in a solvent after the etching.

Figure 7C:
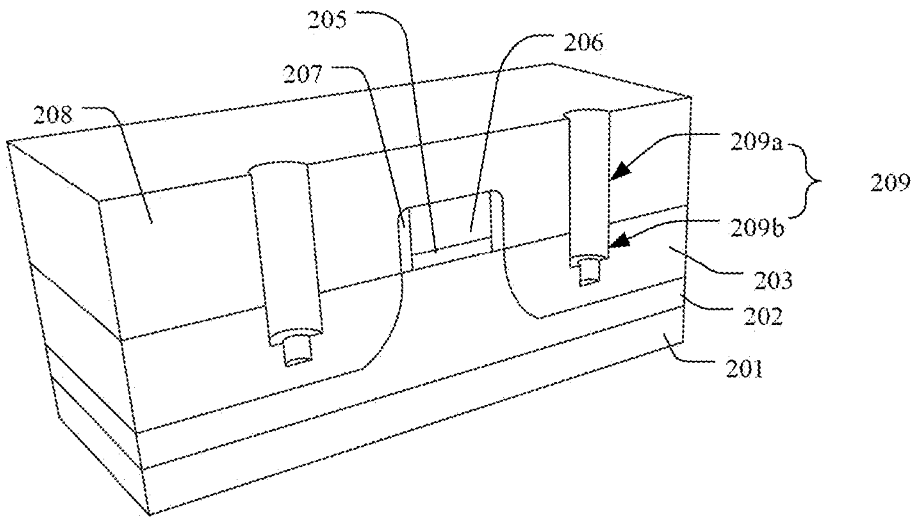

As shown in FIG. 7C, the plurality of levels of second contact holes are formed in the second portion 209*b* of the contact hole 209.

In this step, the contact hole 209 is overlaid one or more times, so as to form the plurality of levels of second contact holes in the second portion 209*b* of the contact hole 209. For example, a second photoresist mask is formed on the surface of the semiconductor structure, an opening is formed on the second photoresist mask, and a diameter of the opening on the second photoresist mask is greater than a diameter of the contact hole 209. The opening of the second photoresist mask is aligned with the contact hole 209 and then etched. In addition, an etching depth is controlled, so that the etching depth for overlay is less than a depth of the contact hole 209, to form two-level second contact holes on the second portion 209*b* of the contact hole 209.

Overlaying is performed a plurality of times to form the plurality of levels of second contact holes in the second portion 209*b* of the contact hole 209. Diameters of openings of photoresist masks used for the overlaying successively increase, and depths of etching successively decrease.

Figure 7D:
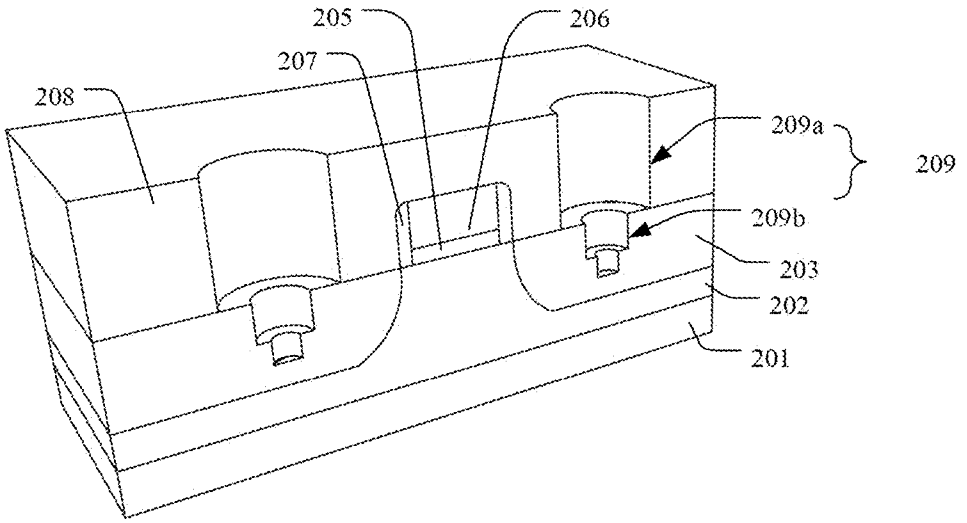

As shown in FIG. 7D, a side wall of the first portion 209*a* of the contact hole 209 is selectively etched, so that the size of the first portion 209*a* of the contact hole 209 is greater than the size of the second portion 209*b* of the contact hole 209.

In this step, for example, the side wall of the first portion 209*a* of the contact hole 209 is selectively etched by wet etching. Through the selectivity of the etchant solution, the side wall of the second portion 209*b* of the contact hole 209 is substantially unaffected when the side wall of the first portion 209*a* of the contact hole 209 is partially removed, so that the first portion 209*a* and the second portion 209*b* of the contact hole 209 have different inner diameters. Specifically, the size of the first portion 209*a* is greater than the size of the second portion 209*b*.

Figure 7E:
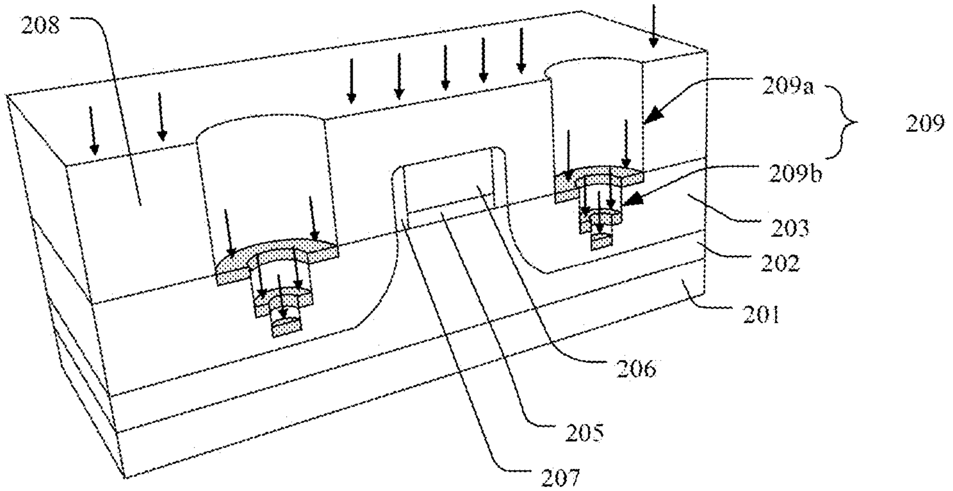

As shown in FIG. 7E, the ion implantation is performed on the bottom surface of the first portion 209*a* of the contact hole 209 and the bottom surface of the plurality of levels of second contact holes in the second portion 209*b* of the contact hole 209.

In the step, the ion implantation is performed on the semiconductor structure. During the ion implantation, the lattices of the bottom surface of the first portion 209*a* of the contact hole 209 and the bottom surface of the plurality of levels of second contact holes in the second portion 209*b* of the contact hole 209 are scattered to form the contact layer 210 more easily in the subsequent process.

Figure 7F:
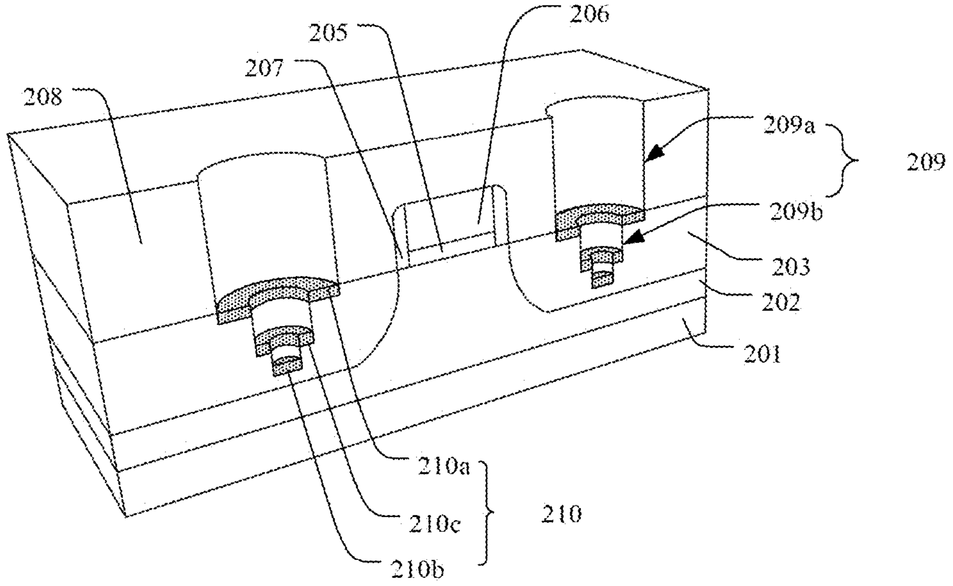

As shown in FIG. 7F, the contact layer 210 is formed on the bottom surface of the first portion 209*a* of the contact hole 209 and the bottom surface of the plurality of levels of second contact holes in the second portion 209*b* of the contact hole 209.

In the step, for example, a metal layer is formed on the bottom surface of the first portion 209*a* of the contact hole 209 and the bottom surface of the plurality of levels of second contact holes in the second portion 209*b* of the contact hole 209. The metal layer is, for example, a nickel (Ni) layer, a platinum (Pt) layer, a cobalt (Co) layer, a nickel-platinum alloy layer, a nickel-cobalt alloy layer, a platinum-cobalt alloy layer, a nickel-platinum-cobalt ternary alloy layer, and the like.

In one or more embodiments, the metal layer is caused to react with silicon on the surface of the doped epitaxial layer 202 by using an annealing process, to form the corresponding contact layer 210. The contact layer 210 can be NiSi, PtSi, CoSi2, NiPtSi, NiCoSi2, PtCoSi2, NiPtCoSi2, etc. according to different materials of the metal layer.

A conductive layer is formed by using the foregoing known deposition process to deposit conductive material, and the thickness of the conductive material deposited at least fills the contact hole 209. The interlayer dielectric layer 208 is used as a stop layer, and mechanical planarization (for example, chemical mechanical polishing) is performed to remove a part of the conductive material located outside of the contact hole 209. As a result, the remaining part of the conductive material fills the contact hole 209 to form the conductive channel 211. The bottom of the conductive channel 211 contacts the epitaxial layer 202 through the contact layer 210. The conductive channels 211 may be, for example, all made of tungsten.

Figure 8:
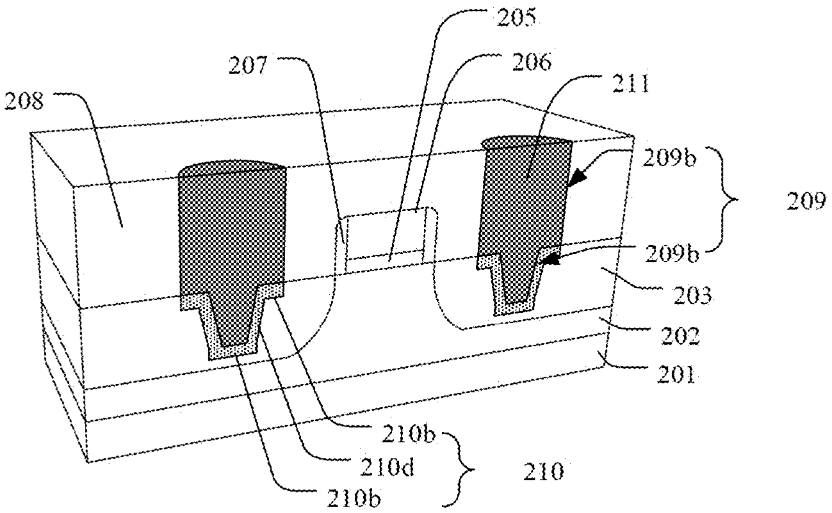
FIG. 8 show schematic structural diagrams of a semiconductor device according to one or more embodiments of the present disclosure.

FIG. 8 shows a schematic structural diagram of a semiconductor device according to one or more embodiments of the present disclosure. As shown in FIG. 8, different from the embodiments shown in FIG. 3, in one or more embodiments disclosed herein, the contact structure further includes a side surface connected to the bottom surface of the first portion 209*a* and the bottom surface of the second portion 209*b*. The side surface is inclined relative to the bottom surface of the first portion 209*a* and the bottom surface of the second portion 209*b*, and a size of a top of the second portion 209*b* is greater than a size of a bottom of the second portion.

The contact layer 210 further includes a fourth contact layer 210*d* covering the side surface, a top end of the fourth contact layer 210*d* contacts the first contact layer 210*a*, and a bottom end contacts the second contact layer 210*b*.

The side wall of the second portion 209*b* of the contact holes 209 located in the epitaxial layer 202 is an inclined surface, and the entire inclined surface covers the contact layer 210. That is to say, the contact layer 210 further includes a fourth contact layer 210*d* located on the inclined surface, so as to further increase the area of the contact layer 210 and further reduce the contact resistance.

The fourth contact layer is added between the first contact layer and the second contact layer, so that a larger contact area is provided between the contact layer 210 and the epitaxial layer 202, and the semiconductor device 200 of this application has a larger contact resistance.

FIG. 9A to FIG. 9E show sectional views of stages of a manufacturing method for manufacturing a semiconductor device according to one or more embodiments of the present disclosure.

Figure 9A:
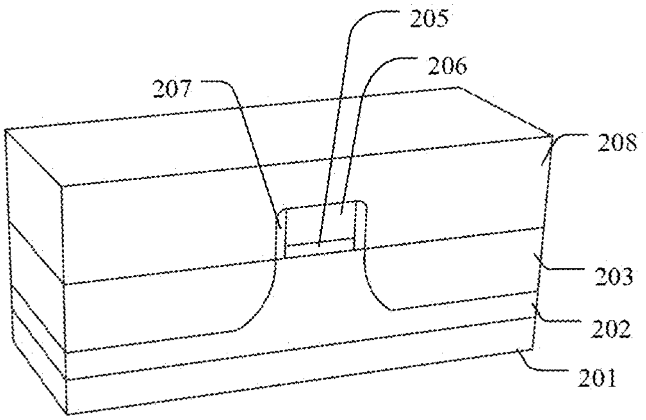
FIG. 9A to FIG. 9E show sectional views of stages of a manufacturing method for manufacturing a semiconductor device according to one or more embodiments of the present disclosure.

The steps shown in FIG. 9A are the same as the steps shown in FIG. 5A, and the details are not described again herein.

Figure 9B:
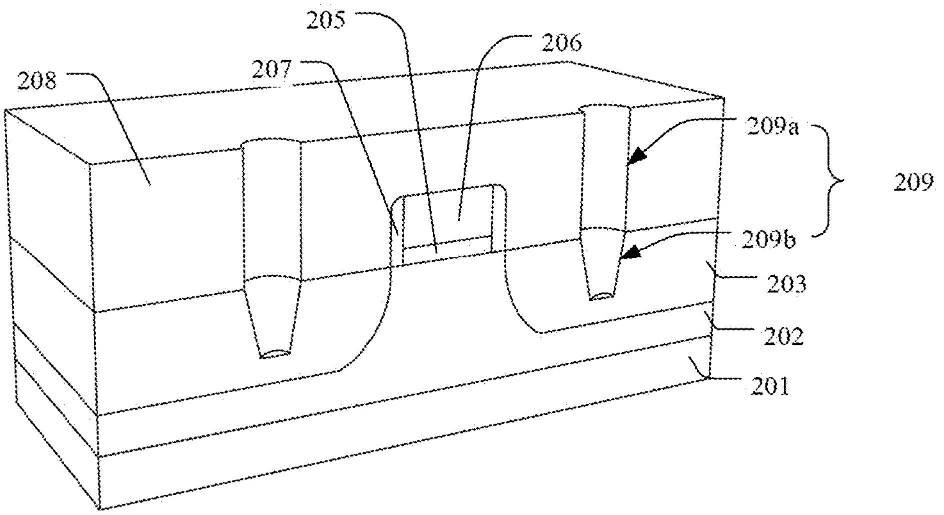

As shown in FIG. 9B, a contact hole 209 extending through the interlayer dielectric layer 208 to the inside of the epitaxial layer 202 is formed.

In this step, for example, a photoresist mask is formed on a surface of a semiconductor structure and then etched, to form a contact hole 209 reaching the inside of the epitaxial layer 202 in the interlayer dielectric layer 208. The etching may be dry etching such as ion milling etching, plasma etching, reactive ion etching, or laser ablation, or may be wet etching using an etchant solution. Etching proceeds downward from an opening in the photoresist mask into the epitaxial layer 202 through the interlayer dielectric layer 208. That is to say, the contact hole 209 includes a first portion 209*a* extending through the interlayer dielectric layer 208 and a second portion 209*b* extending to the inside of the epitaxial layer 202. The photoresist mask is removed by dissolving or ashing in a solvent after the etching.

In this step, the angle of etching is controlled, so that the side wall of the second portion 209*b* of the contact hole 209 is an inclined surface, and a diameter of a bottom of the second portion 209*b* of the contact hole 209 is less than a size of a top of the contact hole 209.

Figure 9C:
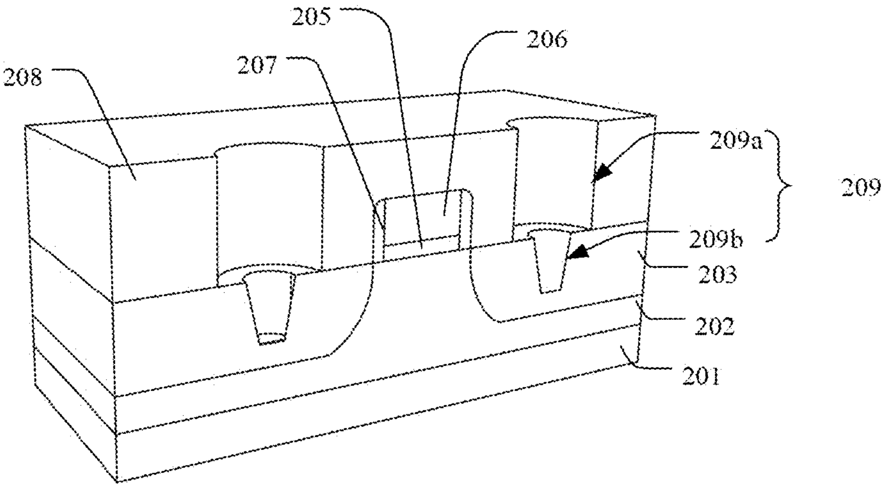

As shown in FIG. 9C, a side wall of the first portion 209*a* of the contact hole 209 is selectively etched, so that the size of the first portion 209*a* of the contact hole 209 is greater than the size of the second portion 209*b* of the contact hole 209.

In this step, for example, the side wall of the first portion 209*a* of the contact hole 209 is selectively etched through wet etching. Through the selectivity of the etchant solution, the side wall of the second portion 209*b* of the contact hole 209 is substantially unaffected when the side wall of the first portion 209*a* of the contact hole 209 is partially removed, so that the first portion 209*a* and the second portion 209*b* of the contact hole 209 have different inner diameters, and at least part of the epitaxial layer is exposed from the bottom surface of the first portion 209*a* of the contact hole 209. That is to say, the second portion 209*b* of the contact hole 209 is open on the bottom surface of the first portion 209*a* of the contact hole 209.

Figure 9D:
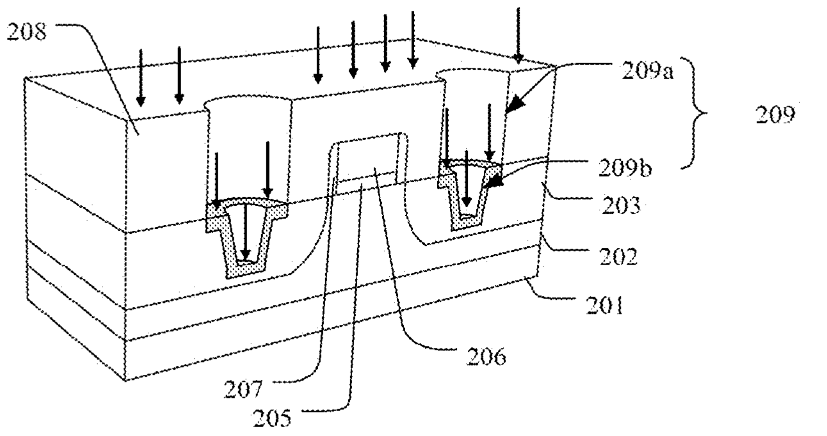

As shown in FIG. 9D, the ion implantation is performed on the bottom surface of the first portion 209*a* of the contact hole 209, the side surface connected to the bottom surface of the first portion 209*a* and the bottom surface of the second portion 209*b*, and the bottom surface of the second portion 209*b* of the contact hole 209.

In this step, the ion implantation is performed on the semiconductor structure. During the ion implantation, since the direction of ion implantation is perpendicular to the direction of the epitaxial layer 202, lattices of the bottom surface of the first portion 209*a* of the contact hole 209, the side surface connected to the bottom surface of the first portion 209*a* and the bottom surface of the second portion 209*b*, and the bottom surface of the second portion 209*b* of the contact hole 209 are scattered to form a contact layer 210 more easily in the subsequent process.

Figure 9E:
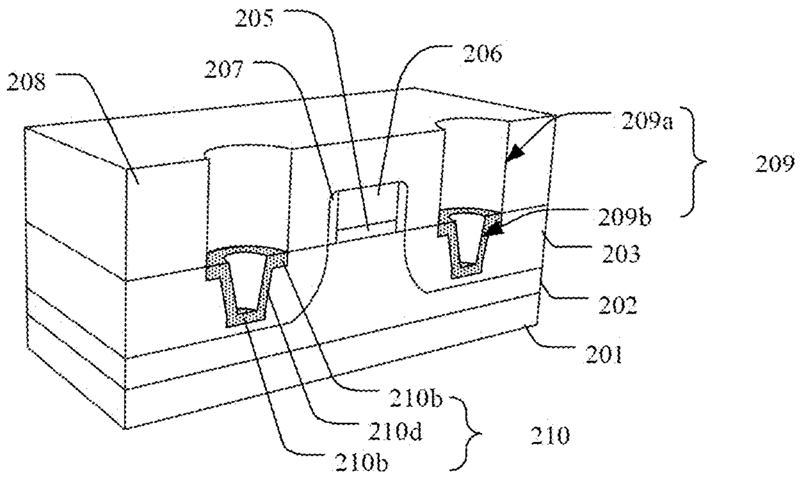

As shown in FIG. 9E, the contact layer 210 is formed on the bottom surface of the first portion 209*a* of the contact hole 209, the side surface connected to the bottom surface of the first portion 209*a* and the bottom surface of the second portion 209*b*, and the bottom surface of the second portion 209*b* of the contact hole 209.

In this step, for example, a metal layer is formed on the bottom surface of the first portion 209*a* of the contact hole 209, the side surface connected to the bottom surface of the first portion 209*a* and the bottom surface of the second portion 209*b*, and the bottom surface of the second portion 209*b* of the contact hole 209. The metal layer is, for example, a nickel (Ni) layer, a platinum (Pt) layer, a cobalt (Co) layer, a nickel-platinum alloy layer, a nickel-cobalt alloy layer, a platinum-cobalt alloy layer, a nickel-platinum-cobalt ternary alloy layer, and the like.

In one or more embodiments, the metal layer is caused to react with silicon on the surface of the doped epitaxial layer 202 by using an annealing process, to form the corresponding contact layer 210. The contact layer 210 may be NiSi, PtSi, CoSi2, NiPtSi, NiCoSi2, PtCoSi2, NiPtCoSi2, etc. according to different materials of the metal layer.

A conductive layer is formed by using the foregoing known deposition process to deposit conductive material, and the thickness of the conductive material deposited at least fills the contact hole 209. The interlayer dielectric layer 208 is used as a stop layer, and mechanical planarization (for example, chemical mechanical polishing) is performed to remove a part of the conductive material located outside of the contact hole 209. As a result, the remaining part of the conductive material fills the contact hole 209 and contacts the contact layer 210 to form the conductive channel 211. The bottom of the conductive channel 211 contacts the epitaxial layer 202 through the contact layer 210. The conductive channels 211 may be, for example, all made of tungsten.

The embodiments in accordance with the present disclosure, as described above, neither describe all details thoroughly nor limit the present disclosure, and are only the specific embodiments. Apparently, many modifications and variations are possible in light of the above description. These embodiments are selected and specifically described in this description to better explain the principle and practical application of the present disclosure, so that those skilled in the art may make good use of the present disclosure and modifications based on the present disclosure. The present disclosure is to be limited only by the claims and their full scope and equivalents.

What is claimed is:

1. A contact structure of a semiconductor device, wherein the semiconductor device comprises an epitaxial layer and a doped region located in the epitaxial layer, and the contact structure comprises:

an interlayer dielectric layer, arranged on the epitaxial layer;

a contact hole, comprising a first portion extending through the interlayer dielectric layer and a second portion extending into the doped region, wherein a width of the first portion is greater than a width of the second portion, the second portion is open on a bottom surface of the first portion, and a bottom surface of the second portion is arranged in the doped region;

a contact layer, comprising a first contact layer arranged on the bottom surface of the first portion and a second contact layer arranged on the bottom surface of the second portion; and a conductive channel, arranged in the contact hole and contacting the contact layer.

2. The contact structure of a semiconductor device according to claim 1, wherein the first contact layer is an annular structure surrounding the conductive channel, an annular bottom surface and an outer side wall of the first contact layer contact the epitaxial layer, and a top surface and an inner side wall of the first contact layer contact the conductive channel.

3. The contact structure of a semiconductor device according to claim 1, wherein the second contact layer is a pillar structure, a bottom surface and a side wall of the second contact layer contact the epitaxial layer, and a top surface of the second contact layer contacts the conductive channel.

4. The contact structure of a semiconductor device according to claim 1, wherein a contact area between the conductive channel and the epitaxial layer is a sum of a contact area between the first contact layer and the epitaxial layer and a contact area between the second contact layer and the epitaxial layer.

5. The contact structure of a semiconductor device according to claim 1, wherein a lower surface of the first contact layer is higher than an upper surface of the second contact layer, or the lower surface of the first contact layer is flush with the upper surface of the second contact layer.

6. The contact structure of a semiconductor device according to claim 1, wherein the second portion of the contact hole further comprises a plurality of levels of second contact holes of different widths, the second contact hole of each level is open on a bottom surface of the second contact hole of a previous level, and widths of the plurality of levels of second contact holes successively decrease from top to bottom.

7. The contact structure of a semiconductor device according to claim 6, wherein the contact layer further comprises a third contact layer arranged on the bottom surface of the second contact hole of each level, and the third contact layer is an annular body surrounding the conductive channel.

8. The contact structure of a semiconductor device according to claim 7, wherein adjacent third contact layers are separated from each other or connected as a whole.

9. The contact structure of a semiconductor device according to claim 1, wherein the contact structure further comprises a side surface connected to the bottom surface of the first portion and the bottom surface of the second portion, the side surface is inclined relative to the bottom surface of the first portion and the bottom surface of the second portion, and a width of a top of the second portion is greater than a width of a bottom of the second portion.

10. The contact structure of a semiconductor device according to claim 9, wherein the contact layer further comprises a fourth contact layer covering the side surface, a top end of the fourth contact layer contacts the first contact layer, and a bottom end contacts the second contact layer.

11. A manufacturing method for manufacturing a contact structure of a semiconductor device, wherein the semiconductor device comprises an epitaxial layer and a doped region located in the epitaxial layer, and the manufacturing method comprises:

forming an interlayer dielectric layer on the epitaxial layer;

forming a contact hole, wherein the contact hole comprises a first portion extending through the interlayer dielectric layer and a second portion extending into the doped region, a width of the first portion is greater than a width of the second portion, the second portion is open on a bottom surface of the first portion, and a bottom surface of the second portion is arranged in the doped region;

forming a contact layer, wherein the contact layer comprises a first contact layer arranged on the bottom surface of the first portion and a second contact layer arranged on the bottom surface of the second portion; and forming a conductive channel filling the contact hole and contacting the contact layer.

12. The manufacturing method according to claim 11, wherein a method for forming the contact hole comprises:

forming a contact hole extending through the interlayer dielectric layer to an inside of the epitaxial layer, wherein the contact hole comprises a first portion extending through the interlayer dielectric layer and a second portion extending into the doped region, the second portion is open on a bottom surface of the first portion, and a bottom surface of the second portion is arranged in the doped region; and selectively etching a side wall of the first portion of the contact hole, so that the width of the first portion is greater than the width of the second portion.

13. The manufacturing method according to claim 12, wherein a side wall of the second portion of the contact hole is selectively etched through wet etching.

14. The manufacturing method according to claim 11, wherein the first contact layer is an annular structure surrounding the conductive channel, an annular bottom surface and an outer side wall of the first contact layer contact the epitaxial layer, and a top surface and an inner side wall of the first contact layer contact the conductive channel.

15. The manufacturing method according to claim 11, wherein the second contact layer is a pillar structure, a bottom surface and a side wall of the second contact layer contact the epitaxial layer, and a top surface of the second contact layer contacts the conductive channel.

16. The manufacturing method according to claim 11, wherein a lower surface of the first contact layer is higher than an upper surface of the second contact layer, or the lower surface of the first contact layer is flush with the upper surface of the second contact layer.

17. The manufacturing method according to claim 11, further comprising: forming a plurality of levels of second contact holes of different widths on the second portion, wherein the second contact hole of each level is open on a bottom surface of the second contact hole of a previous level, and widths of the plurality of levels of second contact holes successively decrease from top to bottom.

18. The manufacturing method according to claim 17, wherein the contact hole is overlaid one or more times to form the plurality of levels of second contact holes in the second portion of the contact hole.

19. The manufacturing method according to claim 17, wherein diameters of openings of photoresist masks used for overlaying successively increase, and etching depths successively decrease.

20. The manufacturing method according to claim 17, wherein a third contact layer is formed on the bottom surface of the second contact hole of each level during formation of the first contact layer and the second contact layer, and the third contact layer is an annular body surrounding the conductive channel.

21. The manufacturing method according to claim 20, wherein adjacent third contact layers are separated from each other or connected as a whole.

22. The manufacturing method according to claim 11, wherein the contact structure further comprises a side surface connected to the bottom surface of the first portion and the bottom surface of the second portion, the side surface is inclined relative to the bottom surface of the first portion and the bottom surface of the second portion, and a width of a top of the second portion is greater than a width of a bottom of the second portion.

23. The manufacturing method according to claim 22, wherein a fourth contact layer is formed on the side surface during formation of the first contact layer and the second contact layer, a top end of the fourth contact layer contacts the first contact layer, and a bottom end contacts the second contact layer.

* * * * *